United States Patent
Honda

(10) Patent No.: US 9,023,728 B2
(45) Date of Patent: May 5, 2015

(54) METHOD OF MANUFACTURING METAL SILICIDE LAYER

(71) Applicant: Kabushiki Kaisha Toshiba, Minato-ku, Tokyo (JP)

(72) Inventor: Makoto Honda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/019,813

(22) Filed: Sep. 6, 2013

(65) Prior Publication Data
US 2014/0287582 A1    Sep. 25, 2014

(30) Foreign Application Priority Data
Mar. 25, 2013 (JP) ................................ 2013-062428

(51) Int. Cl.
*H01L 21/44* (2006.01)
*H01L 21/285* (2006.01)

(52) U.S. Cl.
CPC ............................... *H01L 21/28518* (2013.01)

(58) Field of Classification Search
CPC ............... H01L 21/283; H01L 21/285; H01L 21/28518
USPC .................. 438/630, 649, 651, 682, 655, 683
See application file for complete search history.

(56) References Cited

U.S. PATENT DOCUMENTS

| | | | |
|---|---|---|---|
| 6,180,469 B1 * | 1/2001 | Pramanick et al. | 438/299 |
| 7,365,010 B2 * | 4/2008 | Rhee et al. | 438/682 |
| 2005/0062108 A1 | 3/2005 | Nagai | |
| 2006/0057845 A1 | 3/2006 | Koyanagi et al. | |
| 2007/0254480 A1 | 11/2007 | Matsuda et al. | |
| 2009/0079010 A1 * | 3/2009 | DeLoach et al. | 257/384 |
| 2009/0114993 A1 | 5/2009 | Manabe | |

FOREIGN PATENT DOCUMENTS

| | | |
|---|---|---|
| JP | 2004-228324 | 8/2004 |
| JP | 2004-349471 | 12/2004 |

* cited by examiner

*Primary Examiner* — Kevin M Picardat
(74) *Attorney, Agent, or Firm* — Finnegan, Henderson, Farabow, Garrett & Dunner, LLP

(57) ABSTRACT

According to one embodiment, a method of manufacturing a metal silicide layer, the method includes forming a metal layer including impurities on a silicon layer by a vapor deposition method using a gas of a metal and a gas of the impurities, and forming a metal silicide layer including the impurities by chemically reacting the metal layer with the silicon layer. A thickness and a composition of the metal silicide layer are controlled by an amount of the impurities in the metal layer.

20 Claims, 5 Drawing Sheets

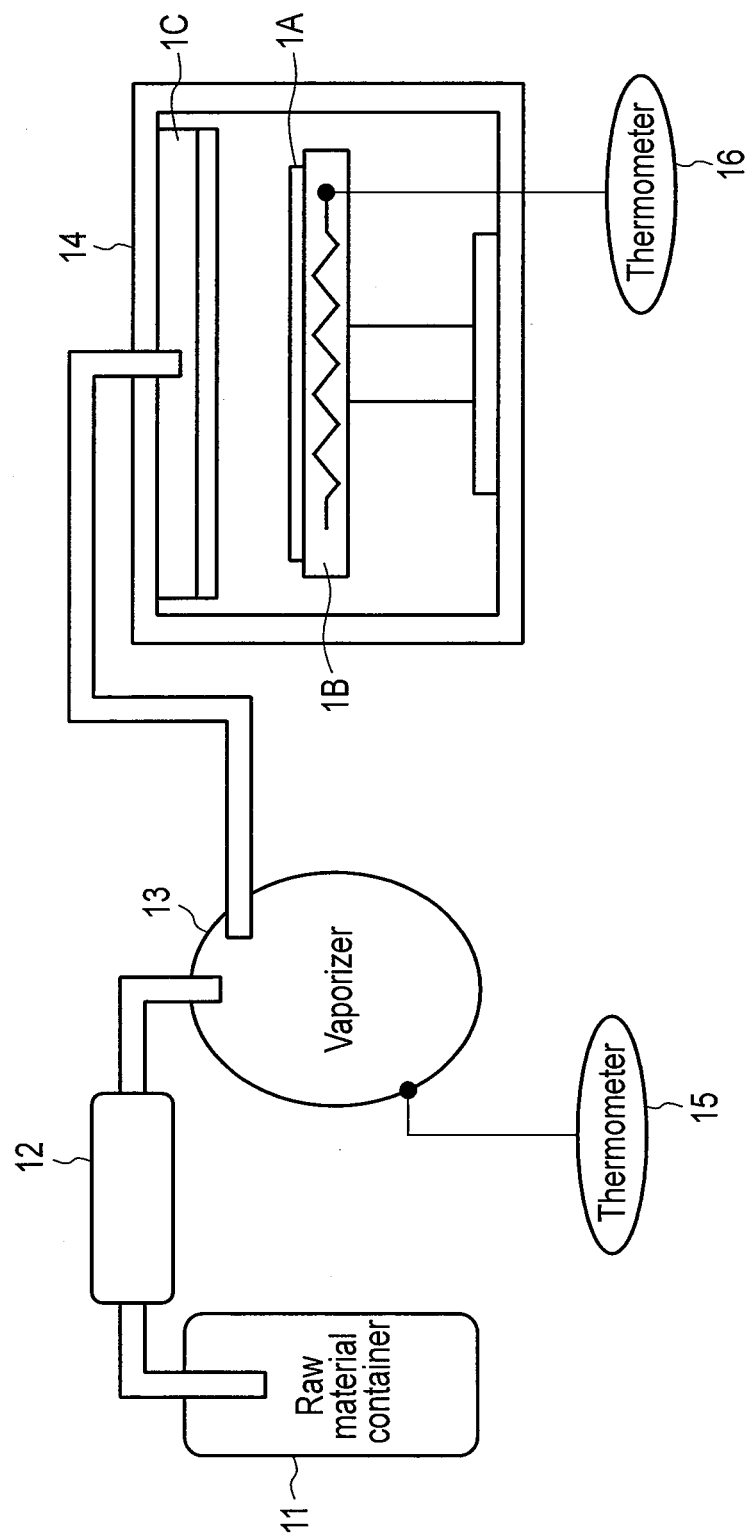
F I G. 1

| Amount of nitrogen in metal layer [atomic%] | Amount of carbon in metal layer [atomic%] | Thickness of metal silicide layer | Composition of metal silicide layer |
|---|---|---|---|
| 5 or less | 8 or less | — | Monosilicide |
| 6 or more | 8 or more | 15 nm or less | Disilicide |
| 10 or more | 8 or more | 15 nm or less | Monosilicide or disilicide |

FIG. 2

| Relationship between amount of nitrogen in metal layer and composition of metal silicide ||||
|---|---|---|---|
| Amount X of nitrogen | X < 5 atomic% | X = 8 atomic% | X > 12 atomic% |
| Thickness | Ni / NiSi / Si | Ni / NiSi$_2$ / Si | Ni / NiSi$_x$ / Si |
| Composition | NiSi monosilicide | NiSi$_2$ disilicide | NiSi$_x$ thin film silicide |
| Resistivity | 12.3 $\mu\Omega$cm | 46 $\mu\Omega$cm | 19 $\mu\Omega$cm |

FIG. 3

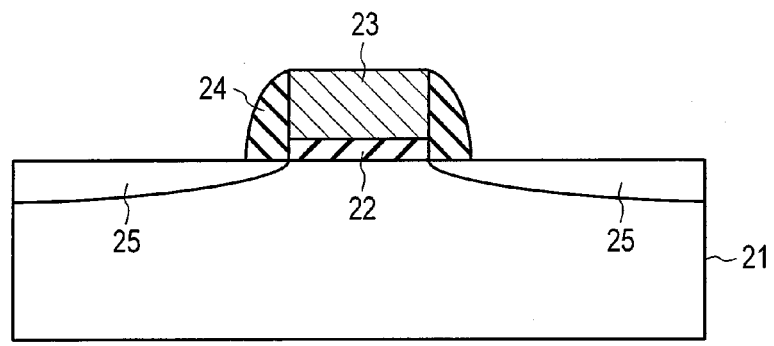
F I G. 4
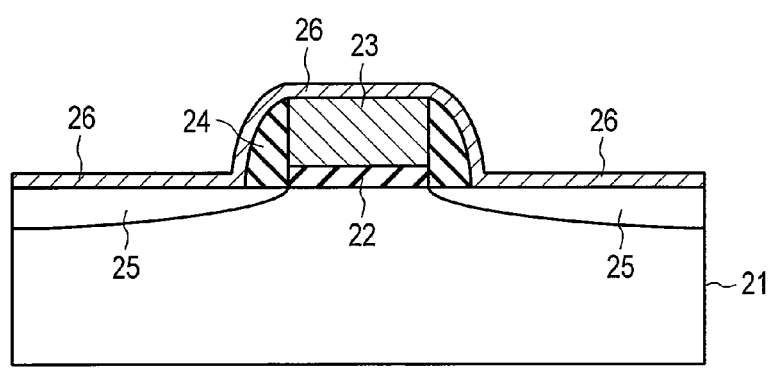
F I G. 5
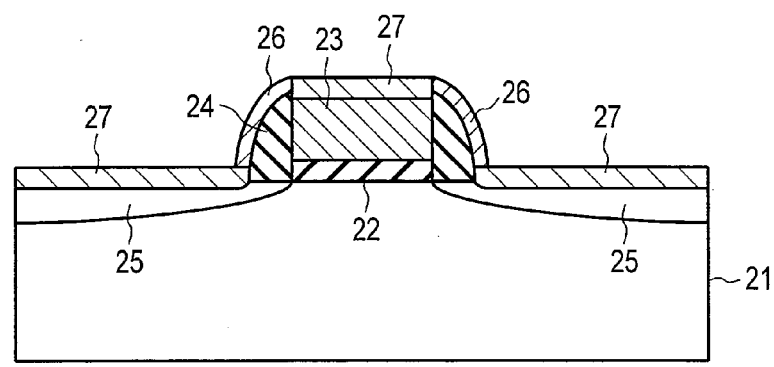
F I G. 6

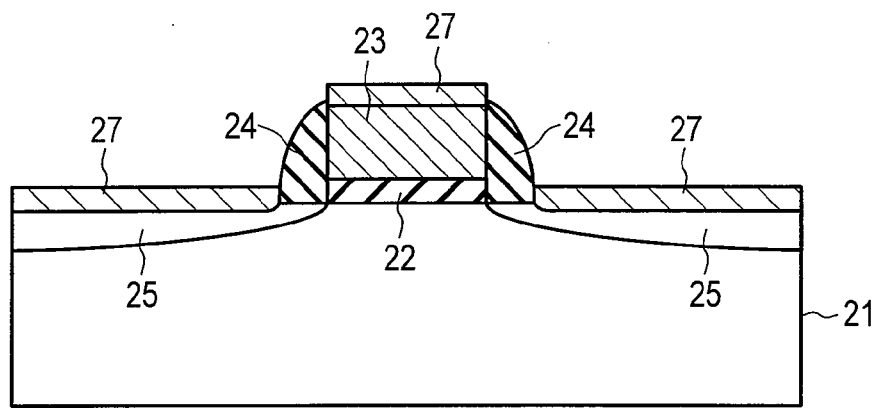
F I G. 7
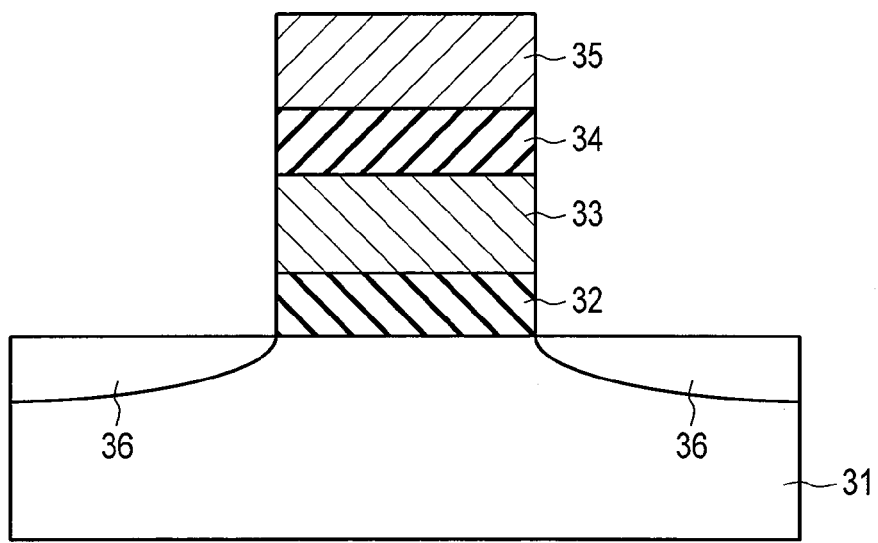
F I G. 8

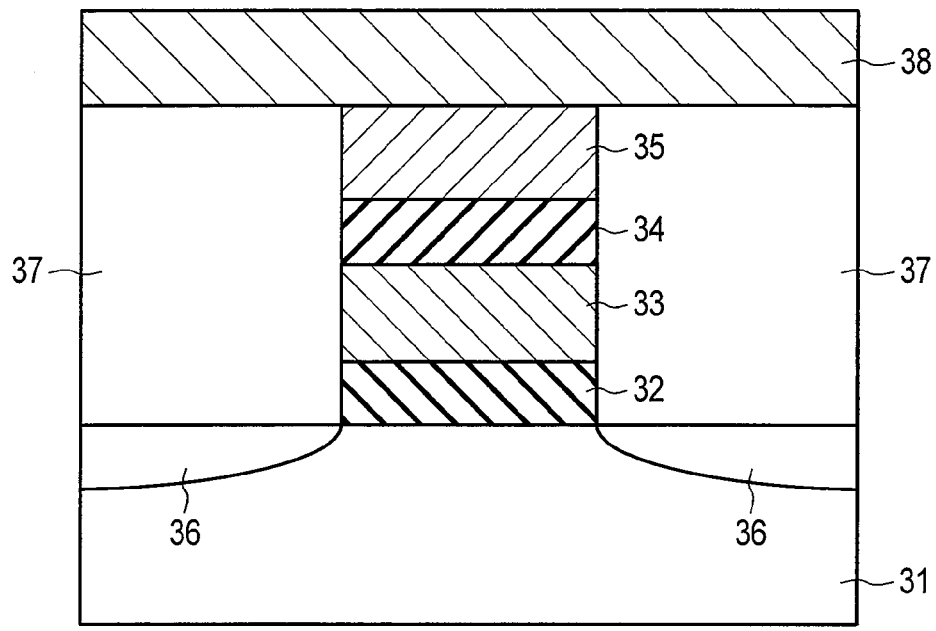
F I G. 9
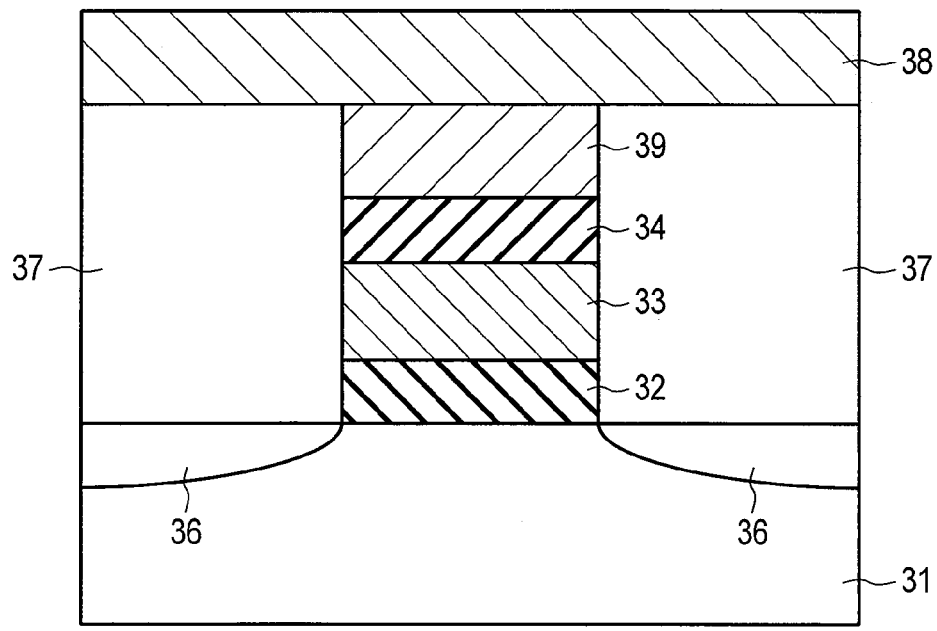
F I G. 10

METHOD OF MANUFACTURING METAL SILICIDE LAYER

CROSS-REFERENCE TO RELATED APPLICATIONS

This application is based upon and claims the benefit of priority from Japanese Patent Application No. 2013-062428, filed Mar. 25, 2013, the entire contents of which are incorporated herein by reference.

FIELD

Embodiments described herein relate generally to a method of manufacturing a metal silicide layer.

BACKGROUND

A metal silicide is a compound formed by thermal reaction (Silicidation) of silicon (Si) and a metal. A metal silicide has an intermediate resistance between those of a metal and polysilicon. Therefore, a metal silicide is used to reduce the contact resistance of the boundary of a metal and a semiconductor, or used as a conductive line material for a memory cell array. However, in Silicidation of Si and a metal, it is difficult to form a thin film of a metal silicide and to obtain a composition of low resistance. To solve this problem, a Silicidation in which metal ions are beforehand injected into Si is known. However, this method has, for example, a problem that the manufacturing process is complex, substrates will easily be damaged and the device structure is limited. Therefore, there is a demand for a Silicidation technique of simplifying the manufacturing process, and free from substrate damage and device structure limitation.

BRIEF DESCRIPTION OF THE DRAWINGS

FIG. 1 is a block diagram illustrating an apparatus for manufacturing a metal silicide layer;

FIG. 2 is a table illustrating a relationship between an amount of impurities in a metal layer, a thickness of a metal silicide layer, and a composition of the metal silicide layer;

FIG. 3 is a table illustrating a relationship between an amount of nitrogen in metal layers and a composition of the metal silicide layer; and FIGS. 4 to 10 are cross-sectional views, each illustrating a method of manufacturing a FET.

DETAILED DESCRIPTION

In general, according to one embodiment, a method of manufacturing a metal silicide layer, the method comprises: forming a metal layer including impurities on a silicon layer by a vapor deposition method using a gas of a metal and a gas of the impurities; and forming a metal silicide layer including the impurities by chemically reacting the metal layer with the silicon layer. A thickness and a composition of the metal silicide layer are controlled by an amount of the impurities in the metal layer.

Embodiments will now be described with reference to the accompanying drawings.

[Basic Idea]

A compound (metal silicide layer) of a Si layer and a metal layer is obtained by stacking the metal layer on the Si layer, and then annealing the boundary of the Si layer and the metal layer Silicidation.

The thickness and composition of the metal silicide layer can be controlled by, for example, the thickness of the metal layer formed on the Si layer, the temperature at which the metal silicide layer is formed, and the gas atmosphere used to form the metal silicide layer.

The thickness and composition of the metal silicide layer can also be controlled by injecting metal ions into a Si layer before Silicidation. However, these manufacturing steps are complex, which inevitably increases the manufacturing cost.

In the embodiments described below, a manufacturing process is proposed in which a metal layer containing the impurities is formed on a silicon layer by a chemical vapor deposition method (such as CVD) using a gas containing a metal and the impurity, and is then made to chemically react with the silicon layer by a heating treatment, such as annealing. The impurity is, for example, nitrogen or carbon.

The metal is, for example, nickel (Ni), titanium (Ti), zirconium (Zr), hafnium (Hf), vanadium (V), niobium (Nb), tantalum (Ta), chrome (Cr), Molybdenum (Mo), tungsten (W), cobalt (Co), platinum (Pt), yttrium (Y), etc.

The above manufacturing process can control the thickness and composition of the resultant metal silicide layer by controlling the amount of impurities in the metal layer. Namely, by simply changing a condition for the chemical vapor deposition method for forming the metal layer, the thickness and composition of the resultant metal silicide layer can be easily changed.

Further, the conditions for chemical deposition will be described in detail in the embodiments below.

When the impurity is nitrogen, the resultant metal silicide layer can be made as a monosilicide layer by setting the amount of the impurity in the metal layer not more than 5 atomic %. In contrast, when the impurity is carbon, the resultant metal silicide layer can be made as a monosilicide layer by setting the amount of the impurity in the metal layer not more than 8 atomic %. A monosilicide is a metal silicide obtained when the compositional ratio between a metal and silicon is 1:1. For instance, NiSi is a monosilicide.

Further, when the impurity is nitrogen, the metal silicide layer can be made silicon-rich by setting the amount of the impurity in the metal layer not less than 6 atomic %. Silicon-rich metal silicides are metal silicides in which the compositional ratio of silicon is greater than that of a metal. For instance, $NiSi_2$ (disilicide) is a silicon-rich material.

In addition, the thickness of the metal silicide layer can be set to 15 nm or less when the impurity is nitrogen and the impurity amount of the metal layer is set not less than 10 atomic %, or when the impurity is carbon and the impurity amount of the metal layer is set not less than 8 atomic %.

The above metal silicide manufacturing method is applicable to, for example, a field effect transistor (FET) in a CMOS circuit. In this case, the silicon layer is one of the source/drain region and the gate electrode of the FET.

Embodiments

FIG. 1 is a block diagram illustrating an apparatus for manufacturing a metal silicide layer.

The manufacturing apparatus comprises raw material container 11, mass-flow controller 12 supplied with a liquid metal from raw material container 11, vaporizer 13 supplied with the liquid metal from mass-flow controller 12, and chamber 14 supplied with a metal gas from vaporizer 13.

Mass-Flow controller 12 adjusts the flow of the liquid metal. Vaporizer 13 vaporizes the liquid metal. The wall temperature of vaporizer 13 can be arbitrarily set using thermometer 15. Chamber 14 has board holder 1B for holding substrate (wafer) 1A. The temperature of substrate folder 1B can be arbitrarily set using thermometer 16. Shower plate 10 for guiding a metal gas to board folder 1B may be provided in chamber 14. In this case, the amounts of impurities can be controlled by adjusting the bore diameter of shower plate 10 to thereby adjust the flow rate of the gas.

The impurities are supplied into chamber 14 through the same pipe as that for supplying the metal gas, or through another pipe, as will be described hereinafter.

(1) First Embodiment

In a first embodiment, a metal and impurities are supplied through the same pipe (the same supply source).

In this embodiment, the metal is, for example, Ni, and the impurities are, for example, nitrogen, carbon, etc.

Since nitrogen has a higher Silicidation inhibiting effect than carbon, it is desirable to control the amount of nitrogen preferentially.

Ni containing nitrogen and carbon is guided from raw material container 11 into vaporizer 13, where it is vaporized. After that, Ni gas containing nitrogen and carbon is guided from vaporizer 13 into chamber 14. In chamber 14, a metal layer containing nitrogen and carbon is formed on a silicon layer included in substrate 1A by a chemical vapor deposition method (e.g., CVD) using a gas containing the metal, nitrogen and carbon.

The wall temperature of vaporizer 13 is set lower by, for example, 50° C. than a film forming temperature.

When the shower plate 10 is installed in chamber 14, Ni gas guided into chamber 14 is supplied onto substrate 1A through shower plate 1C.

The bonding state of the Ni layer containing impurities (nitrogen and carbon) and provided on substrate 1A can be controlled by controlling the temperature of vaporizer 13 and the flow rate of the Ni gas assumed when the gas is introduced into chamber 14.

(2) Second Embodiment

In a second embodiment, the metal and the impurities are supplied through different pipes (different supply sources). However, the metal may contain impurities. The other structure of the second embodiment is similar to that of the first embodiment, and hence no detailed description will be given thereof.

In this embodiment, the metal is, for example, Ni, and the impurities are, for example, carbon and nitrogen.

When nitrogen is supplied as an impurity, NH3 gas and H2 gas are introduced into chamber 14 through a path different from that of Ni gas, and are mixed with the Ni gas on substrate (wafer) 1A.

H2 is an assist gas for reducing the impurity concentration of a conductive film to assist silicidation.

If the amount of NH3 is increased in the mixture gas of NH3 and H2, the amount of nitrogen is increased in the Ni film. Further, if the wafer temperature is increased, the amount of nitrogen in the Ni film is decreased. In contrast, in the case of carbon, if the wafer temperature is increased, the amount of carbon in the Ni film is increased.

(3) Third Embodiment

In a third embodiment, the temperature of the wafer is set in order to prevent reaction of Si and a metal during forming a metal layer. The other structure of the third embodiment is similar to that of the first or second embodiment, and hence no detailed description will be given thereof.

In this embodiment, the metal is, for example, Ni. And the wafer temperature is set to, for example, 350° C. or less.

By setting the wafer temperature is set to 350° C. or less, reaction of Ni and Si during forming a metal layer can be prevented.

Further, in order to prevent adsorption of the metal gas other than that on the wafer surface, the wall temperature of chamber 14 is set equal to or less than that of vaporizer 13 during forming the metal layer. Furthermore, if chamber 14 contains shower plate 1C, the temperature of shower plate 1C is also set equal to or less than that of vaporizer 13.

(4) Fourth Embodiment

The above-described first to third embodiments relate to conditions for vapor deposition (e.g., reaction gas supply method, temperature, etc.). On the other hand, a fourth embodiment discloses the relationship between the amount of each impurity in the metal layer and the thickness and composition of the resultant metal silicide layer, obtained when the amount of each impurity is changed by changing the vapor deposition conditions.

FIG. 2 shows the relationship between the amount of each impurity in the metal layer, and the thickness and composition of the metal silicide layer. FIG. 3 shows the relationship between the amounts of nitrogen in metal layers and the compositions of metal silicides.

As shown in FIGS. 2 and 3, when the amount of nitrogen in a metal layer on a wafer is 5 atomic % or less, or the amount of carbon therein is 8 atomic % or less, a monosilicide layer (NiSi) is formed. The monosilicide layer contains nitrogen of at least 5 atomic % or less, or carbon of 8 atomic % or less.

Further, when the amount of nitrogen in the metal layer is not less than 10 atomic %, or the amount of carbon therein is not less than 8 atomic %, a thin silicide layer with a thickness of 15 nm or less is formed. The thin silicide layer contains nitrogen of at least 10 atomic % or more, or carbon of 8 atomic % or more.

Moreover, when the amount of nitrogen in the metal layer is not less than 6 atomic %, a metal silicide layer of an Si-rich composition, e.g., a disilicide ($NiSi_2$) layer, in which the number of Si atoms is greater than that of Ni atoms, can be formed. The Si-rich silicide layer contains nitrogen of at least 6 atomic % or more.

As described above, in the fourth embodiment, the thickness and composition of the metal silicide layer can be controlled by adding nitrogen and carbon into the metal layer that is to be made to react with the Si layer. As a result, a desired metal silicide layer can be formed by a device process, such as a process for forming a metal silicide layer of a high thermal resistance, or a process for forming a thin metal silicide layer on a patterned substrate.

(5) Summary

As described above, in the first to fourth embodiments, the thickness and composition of the metal silicide layer can be controlled by changing the amounts of impurities in the metal layer before Silicidation.

Thus, a desired metal silicide layer can be formed by a device process, such as a process for forming a metal silicide layer of a high thermal resistance, or a process for forming a thin metal silicide layer on a patterned substrate.

When a metal silicide layer is formed on the source/drain region of a FET, it is desirable to form a layer that is thin and has a composition of high thermal resistance, e.g., disilicide (NiSi$_2$). This is because the resultant FET is prevented from having a high resistance due to junction leakage or agglomeration of the metal silicide layer. Further, when the gate electrode of a FET is subjected to Silicidation (e.g., full Silicidation), it is desirable to form, for example, a monosilicide (NiSi) layer that is thick and has a low resistance.

Applied Examples

A description will now be given of a case where the above-described embodiments are applied to the manufacture of a FET (field effect transistor).

(1) Logic Transistor

As shown in FIG. 4, a gate oxide film 22 is formed on a Si substrate 21. On the gate oxide film 22, a gate electrode (polysilicon) 23 is formed, and side walls 24 are formed on the side walls of the gate electrode 23. Using the gate electrode 23 and the side walls 24 as masks, ion injection is performed to thereby form source/drain regions 25 on surface regions of the Si substrate 21.

Subsequently, as shown in FIG. 5, a Ni film 26 containing impurities (nitrogen, carbon, etc.) is formed on the entire surface of the Si substrate 21.

The Ni film 26 is formed as described in the embodiments.

After that, the portions of the Ni film 26 on the source/drain regions 25 and the gate electrode 23 are annealed, i.e., subjected to Silicidation (silicide process).

As a result, as shown in FIG. 6, a Ni silicide layer 27 that is thin and has a composition of a high thermal resistance, for example, disilicide (NiSi$_2$), is formed on the source/drain regions 25. At this time, the Ni silicide layer 27 is also formed on the gate electrode 23.

Thereafter, the remaining Ni film 26, which was not converted into a silicide, is removed, whereby a FET with the Ni silicide layers 27 formed on the source/drain regions 25 and the gate electrode 23 is formed as shown in FIG. 7.

(2) Memory cell transistor

Firstly, as shown in FIG. 8, a first insulating layer 32, a charge storage layer 33, a second insulating layer 34 and a control gate electrode (polysilicon layer) 35 are formed on a Si substrate 31. Using this gate lamination structure as a mask, ion injection is performed to form source/drain regions 36.

Further, an insulating layer 37 is formed on the Si substrate 31 to cover the side surfaces of the gate lamination structure.

Subsequently, as shown in FIG. 9, a Ni layer 38 is formed on the control gate electrode 35 by the method described in the above embodiments. After that, the Ni layer 38 on the control gate electrode 35 is subjected to Silicidation.

As a result, the control gate electrode 35 shown in FIG. 9 is converted into a Ni silicide layer 39 that is thick and has a composition of low resistance, e.g., a monosilicide layer (NiSi), as shown in FIG. 10.

Although the fourth embodiment describes full silicide in which all the control gate electrode 35 of FIG. 9 is subjected to Silicidation, only part of the control gate electrode 35 of FIG. 9 may be subjected to Silicidation.

As a result, a memory transistor is formed.

CONCLUSION

In the above-described embodiments, the thickness and composition of a metal silicide layer can be controlled by adjusting the amounts of impurities, such as nitrogen and carbon, added into the metal layer. Since there is no complex manufacturing process, the characteristics of the metal silicide layer can be changed by a device process, such as a process for forming a metal silicide layer of a high thermal resistance, or a process for forming a silicide layer on a patterned substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a metal silicide layer, the method comprising:
    forming a metal layer including impurities on a silicon layer by a chemical vapor deposition using a gas of a metal and a gas of the impurities; and
    forming a metal silicide layer including the impurities by chemically reacting the metal layer with the silicon layer,
    wherein the amount of the impurities in the metal layer is not less than 10 atomic % where the impurities are nitrogen.

2. The method of claim 1, wherein the metal and the impurities are evaporated in a vaporizer.

3. The method of claim 1, wherein the gas of the metal and the gas of the impurities are introduced into a chamber through a single path.

4. The method of claim 1, wherein the gas of the metal and the gas of the impurities are introduced into a chamber through different paths.

5. The method of claim 2, wherein the wall temperature of the vaporizer is lower than a film forming temperature of the metal layer by not less than 50° C.

6. The method of claim 1, wherein the gas of the metal and the gas of the impurities are supplied onto the silicon layer through a shower plate.

7. The method of claim 1, wherein a temperature of the silicon layer is set to a value of not more than 350° C. during the forming of the metal layer.

8. The method of claim 1, wherein the metal silicide layer has a state of being silicon rich.

9. The method of claim 1, wherein the metal silicide layer is NiSi.

10. The method of claim 1, wherein the metal silicide layer is formed by converting all of the silicon layer to the metal silicide layer.

11. The method of claim 10, wherein the metal silicide layer functions as a gate electrode of a full silicide structure.

12. The method of claim 8, wherein the metal silicide layer includes at least one of Ni, Ti, Zr, Hf, V, Nb, Ta, Cr, Mo, W, Co, Ni, Pt and Y.

13. The method of claim 1, wherein the metal silicide layer has a thickness of not more than 15 nm.

14. A method of manufacturing a metal silicide layer, the method comprising:
    forming a metal layer including impurities on a silicon layer by a chemical vapor deposition using a gas of a metal and a gas of the impurities; and
    forming a metal silicide layer including the impurities by chemically reacting the metal layer with the silicon layer, wherein the amount of the impurities in the metal layer is not less than 8 atomic % where the impurities are carbon.

15. The method of claim 14, wherein the metal silicide layer has a thickness of not more than 15 nm.

16. The method of claim 14, wherein the metal and the impurities are evaporated in a vaporizer.

17. The method of claim 14, wherein the gas of the metal and the gas of the impurities are introduced into a chamber through a single path.

18. The method of claim 14, wherein the gas of the metal and the gas of the impurities are introduced into a chamber through different paths.

19. The method of claim 16, wherein the wall temperature of the vaporizer is lower than a film forming temperature of the metal layer by not less than 50° C.

20. The method of claim 14, wherein the gas of the metal and the gas of the impurities are supplied onto the silicon layer through a shower plate.

* * * * *